United States Patent
McDonough et al.

(10) Patent No.: US 6,727,777 B2
(45) Date of Patent: Apr. 27, 2004

(54) APPARATUS AND METHOD FOR ANGLED COAXIAL TO PLANAR STRUCTURE BROADBAND TRANSITION

(75) Inventors: Robert J. McDonough, Ventura, CA (US); Weimin Sun, Thousand Oaks, CA (US)

(73) Assignee: Vitesse Semiconductor Corporation, Camarillo, CA (US)

( * ) Notice: Subject to any disclaimer, the term of this patent is extended or adjusted under 35 U.S.C. 154(b) by 0 days.

(21) Appl. No.: 09/837,615

(22) Filed: Apr. 18, 2001

(65) Prior Publication Data

US 2002/0153977 A1 Oct. 24, 2002

Related U.S. Application Data

(63) Continuation-in-part of application No. 09/836,453, filed on Apr. 16, 2001.

(51) Int. Cl.⁷ .............................. H01P 5/02; H01P 1/04
(52) U.S. Cl. ................. 333/33; 333/247; 333/260; 257/728
(58) Field of Search .................. 333/33, 247, 260; 257/728

(56) References Cited

U.S. PATENT DOCUMENTS

| | | | | |
|---|---|---|---|---|
| 4,262,265 A | * | 4/1981 | Nygren et al. | 333/246 X |
| 4,346,355 A | * | 8/1982 | Tsukii | 333/260 X |
| 4,494,083 A | * | 1/1985 | Josefsson et al. | 333/246 X |
| 4,995,815 A | * | 2/1991 | Buchanan et al. | 333/260 X |
| 5,266,912 A | | 11/1993 | Kledzik | 333/247 |
| 5,294,897 A | * | 3/1994 | Notani et al. | 333/297 X |
| 5,406,125 A | * | 4/1995 | Johnson et al. | 333/247 X |
| 5,459,287 A | | 10/1995 | Swamy | 174/266 |
| 5,832,598 A | | 11/1998 | Greenman et al. | 29/840 |
| 6,086,383 A | | 7/2000 | Fasano et al. | 439/63 |
| 6,091,147 A | | 7/2000 | Furuyama | 257/730 |
| 6,130,483 A | | 10/2000 | Shizuki et al. | 257/778 |
| 6,137,693 A | | 10/2000 | Schwiebert et al. | 361/803 |
| 6,143,616 A | | 11/2000 | Geusic et al. | 438/389 |
| 6,194,669 B1 | | 2/2001 | Bjorndahl et al. | 174/261 |
| 6,194,750 B1 | | 2/2001 | Carroll et al. | 257/275 |
| 6,204,448 B1 | | 3/2001 | Garland et al. | 174/52.3 |
| 6,211,541 B1 | | 4/2001 | Carroll et al. | 257/275 |
| 6,215,377 B1 | | 4/2001 | Douriet | 333/247 |
| 2001/0015288 A1 | | 8/2001 | Dove et al. | |

* cited by examiner

Primary Examiner—Benny Lee
(74) Attorney, Agent, or Firm—Christie, Parker & Hale, LLP

(57) ABSTRACT

A semiconductor device package adapted for use with high frequency signals and/or coaxial connections. The package has an angled coaxial input shielded by a plurality of vias. In one embodiment the coaxial input is orthogonal to a leadframe, and the coaxial input is matched to a transmission line on the leadframe.

30 Claims, 6 Drawing Sheets

US 6,727,777 B2

APPARATUS AND METHOD FOR ANGLED COAXIAL TO PLANAR STRUCTURE BROADBAND TRANSITION

CROSS-REFERENCE TO RELATED APPLICATION

This application is a continuation-in-part of pending application Ser. No. 09/836,453, filed Apr. 16, 2001, entitled APPARATUS AND METHOD FOR ANGLED COAXIAL TO PLANAR STRUCTURE BROADBAND TRANSITION, the entire contents of the application is hereby expressly incorporated by reference as if set forth herein in full.

BACKGROUND OF THE INVENTION

The present invention relates generally to packages and connections adapted for use with high frequency signals and devices, and more particularly to semiconductor device packages having coaxial inputs.

Digital transmission systems and semiconductor circuits increasingly transmit, receive, and process information at high data rates. Increased data rate of signal transmission allows for increased transfer of information over a set period of time. Increased speed of operation of processing circuitry allows for increased processing of transmitted information over a set period of time. Both increased data rate and increased speed of operation of processing circuitry often means that signals propagated to the circuitry or within the circuitry are somewhat high frequency signals.

Unfortunately, high frequency signals tend to radiate energy as they propagate, and tend to do so in a number of directions. In other words, high frequency signals tend to have a number of propagation modes, many of which are not necessarily down a conductive wire path or signal trace forming a signal pathway or data transmission line.

The radiated energy and the number of propagation modes presents several problems. Energy radiated outside the data transmission line reduces the energy available for propagating signals down the data transmission line. The radiated energy therefore results in signal attenuation. Energy radiated from one data transmission line may also interfere with signals propagating on nearby data transmission lines, resulting in crosstalk. Thus, both signal attenuation and crosstalk may result in signal degradation. Moreover, one solution to unacceptable signal attenuation is to increase signal strength, which in turn results in increased energy radiation and increased crosstalk.

Signal attenuation and crosstalk may occur at many locations. One area of concern is the connection between relatively lengthy data transmission lines and semiconductor circuit devices receiving or transmitting signals over the data transmission lines. Lengthy data transmission lines may be designed and constructed to minimize errant energy radiation. Similarly, within an actual semiconductor device steps may be taken, such as providing multiple metallization layers and appropriately routing signals, to reduce the effects of radiated energy on operation of the semiconductor device itself. Transition of signals between a lengthy data transmission line and the semiconductor device, usually through walls of a package containing the semiconductor device, is problematic, as is ensuring that radiated energy within the package does not have negative effects outside of the package.

SUMMARY OF THE INVENTION

The present invention therefore provides a semiconductor device package adapted for use with high frequency signals and/or coaxial connections. In one embodiment, the present invention comprises a leadframe including an aperture that is adapted to pass a signal on a coaxial transmission medium through the leadframe. A die is operatively disposed on the leadframe to receive a semiconductor device and a signal path is located between the aperture and the die. The leadframe also contains a plurality of vias to provide an electromagnetic shielding for signals that are passed through the aperture.

These and other aspects of the present invention will be more fully appreciated when the following drawings are viewed in conjunction with the following detailed description.

DETAILED DESCRIPTION OF PREFERRED EMBODIMENTS

Figure 1:
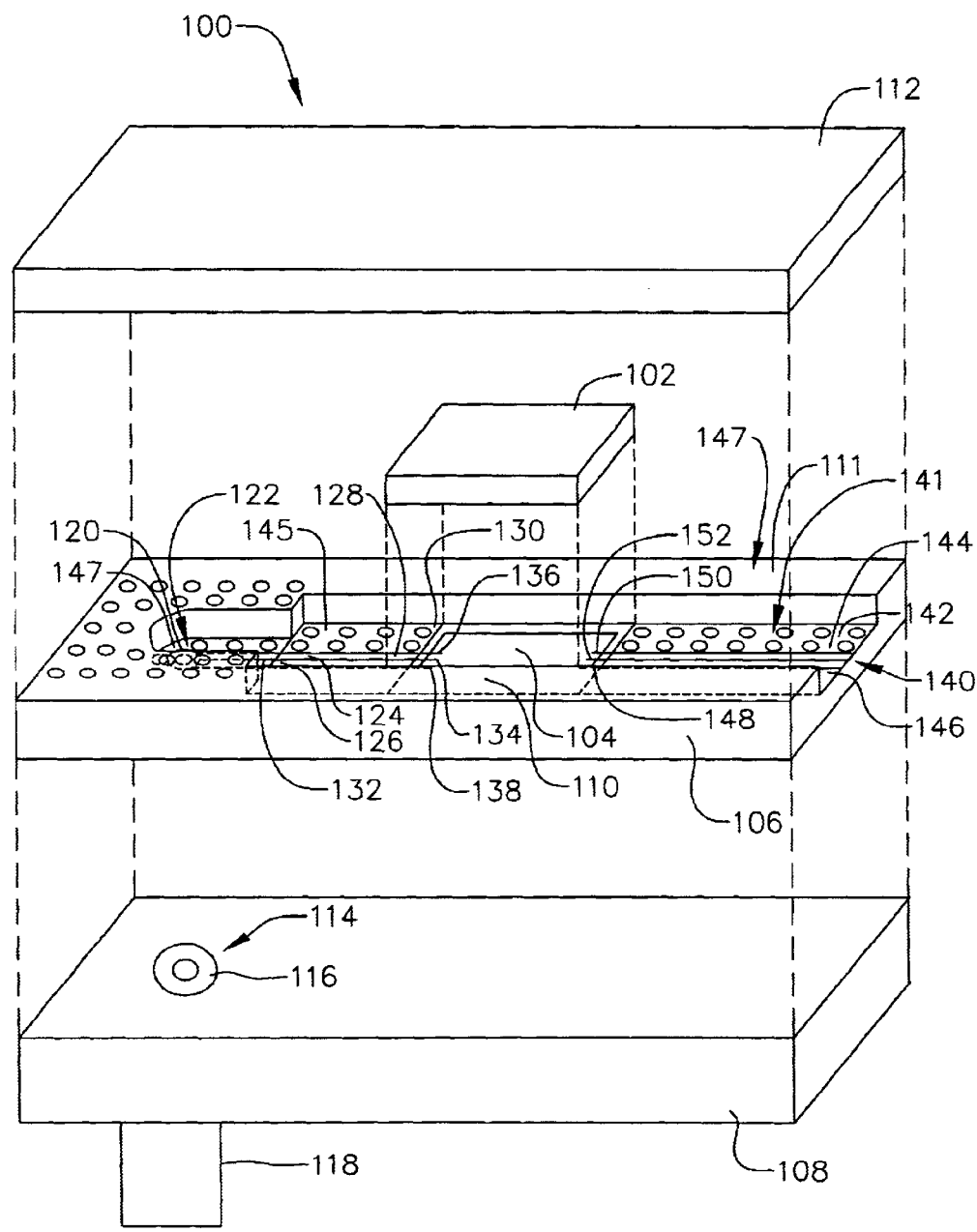
FIG. 1 illustrates an exploded perspective view of a package in accordance with aspects of the present invention.

FIG. 1 illustrates an exploded view of a package 100 in accordance with aspects of the present invention. The package is adapted to house a semiconductor circuit 102 on a die 104. The die is placed on a leadframe 106. The leadframe, in turn, rests on a heat spreader 108 utilized to assist in regulation of the temperature of the semiconductor device, which can produce significant amounts of heat during operation. The leadframe, as illustrated in FIG. 1, includes sidewalls 110 and 111. A cover 112 rests on the sidewalls. In one embodiment, the leadframe 106 is a printed circuit board.

The package includes ports to receive or transmit signals. In the embodiment of FIG. 1 a first port 114, which for purposes of discussion will be considered an input port, extends through the heat spreader and the leadframe, and does so substantially orthogonally to a plane formed by the surface of the die. Accordingly, the heat spreader includes an aperture 116 adapted to receive a coaxial transmission medium 118. The aperture in the heat spreader is matched to an aperture 120 in the leadframe adapted for the same purpose, namely passing a signal using a coaxial connection. In the embodiment described, the coaxial connection is used to allow for increased signal integrity for high frequency signals. In other embodiments, however, the coaxial connection is used due to differing aspects of transmitted signals.

The leadframe includes a signal path 122, in this case a microstrip, running from the area approximate the aperture to approximate the die. The signal path forms substantially a straight line 124, and on either side of the line are dielectric gaps, 126 and 128. A metallization layer 130 is opposite the dielectric gap. As is discussed in more detail later, the metallization layer is connected to a ground plane.

A short wire 132 connects the signal carrier of the coaxial connection to the signal path. Another short wire 134 connects the signal path to a location on the die where a connection to the semiconductor device is made. Two further short wires, 136 and 138, connect the metallization layer to locations on the die.

As illustrated, a second port 140, which will be considered an output port, is substantially planar with the semiconductor die. The second port is also connected to the die by way of a microstrip 141 and short wires, 148, 150 and 152, with the microstrip flanked by dielectric gaps 144 and 146, surrounded by a metallization layer 142 connected to ground.

Figure 2:
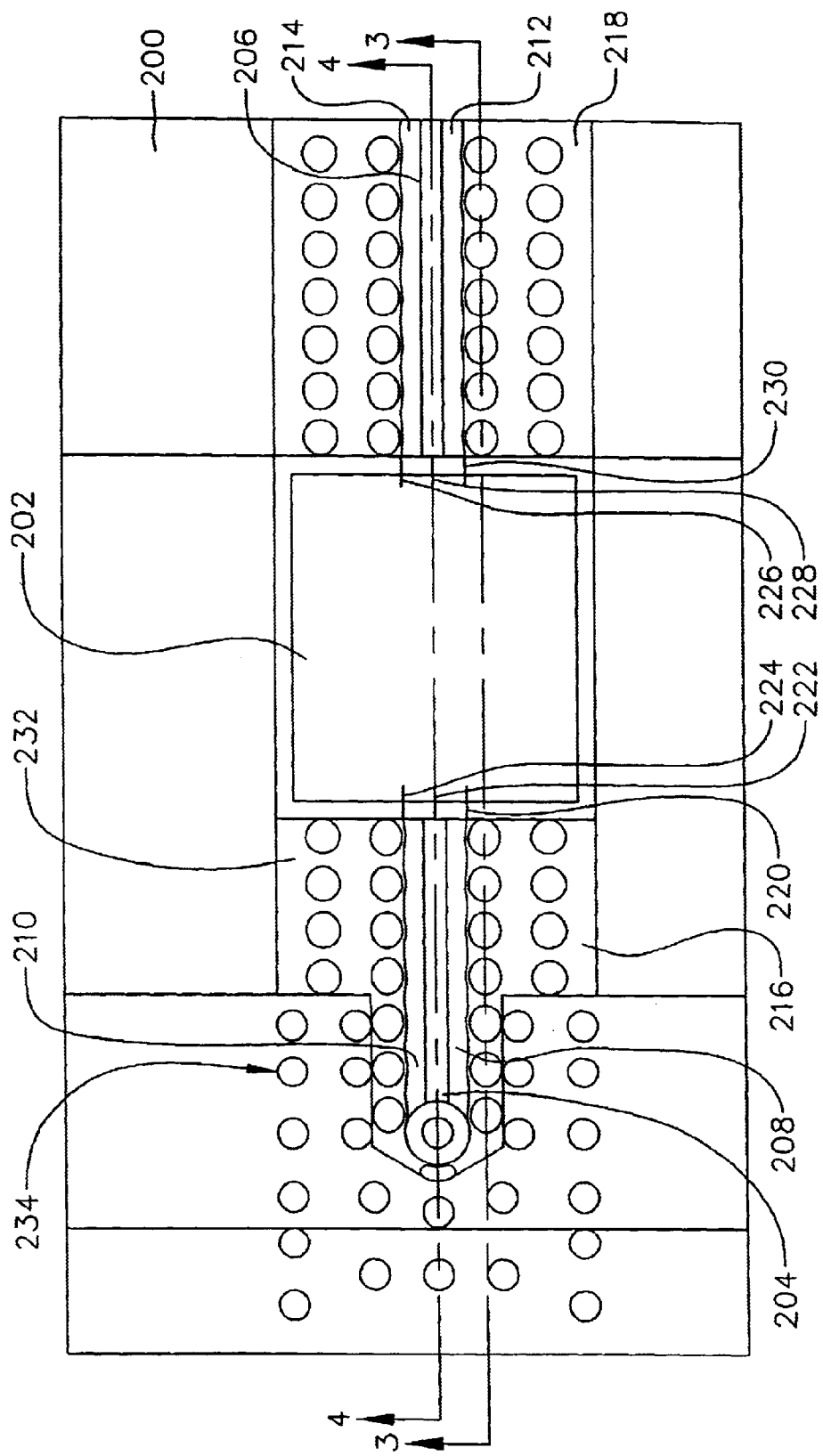
FIG. 2 illustrates a top view of a cross-section of the package of FIG. 1.

FIG. 2 illustrates a top view of the leadframe of FIG. 1. The leadframe 200 includes a die 202 adapted to receive a semiconductor device. Leading away from opposite sides of the die are microstrips, 204 and 206. The microstrips are adapted to carry input and/or output signals. Adjacent to and parallel with the microstrips are unmetalized dielectric surfaces 208, 210 and 212, 214. About the dielectric surfaces are metallization areas, 216 and 218. The microstrip and the metallization areas are connected to locations on the die by wires, 220, 222, 224, 226, 228 and 230. In one embodiment the wires are preferably as short a length as possible.

As may also be seen in FIG. 1, the top surface of the leadframe has a first section 145 having a lower level, and a second section 147 having an upper level. In other words, portions of the upper surface of the leadframe are recessed. Thus, the die area, and a portion on one side of the die towards what was termed the output port are recessed in the upper surface of the leadframe. Similarly, a portion on a side of the die leading towards what was termed the input port is also recessed. The portion towards the input port, however, includes a narrow neck 147 leading towards the coaxial input. The coaxial input, therefore, is largely surrounded by a raised area of the leadframe.

Figure 4:
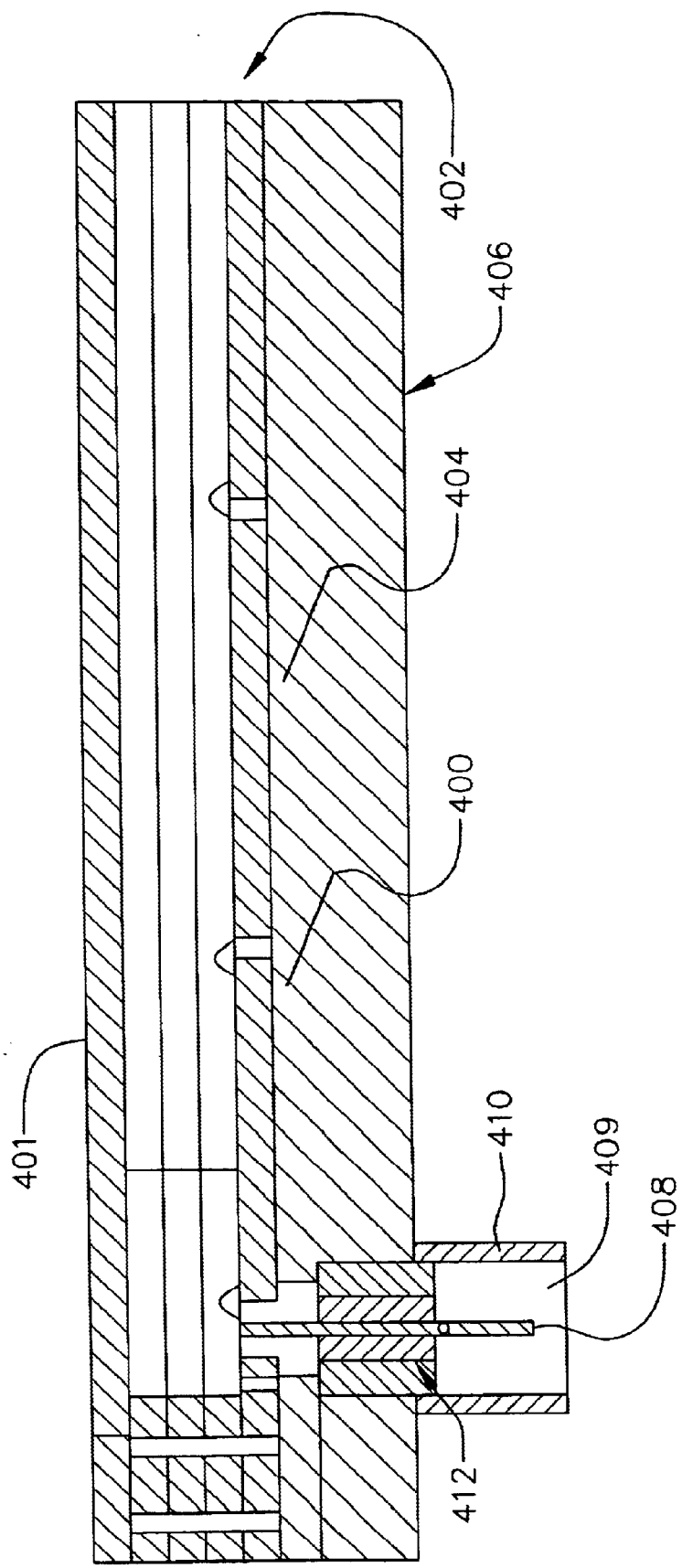
FIG. 4 illustrates a cross-section of the package of FIG. 1 showing a signal pathway.

As may be seen in FIG. 4, the lower level of the leadframe largely, not including the die area, includes a layer of metallization 400. The leadframe therefore forms a substrate 402. The bottom surface 404 of the substrate, which is eutectically attached to the heat spreader 406 (of a copper molybdenum metal in one embodiment), also has a layer of metallization, with the exception of an area about the coaxial input.

Figure 3:
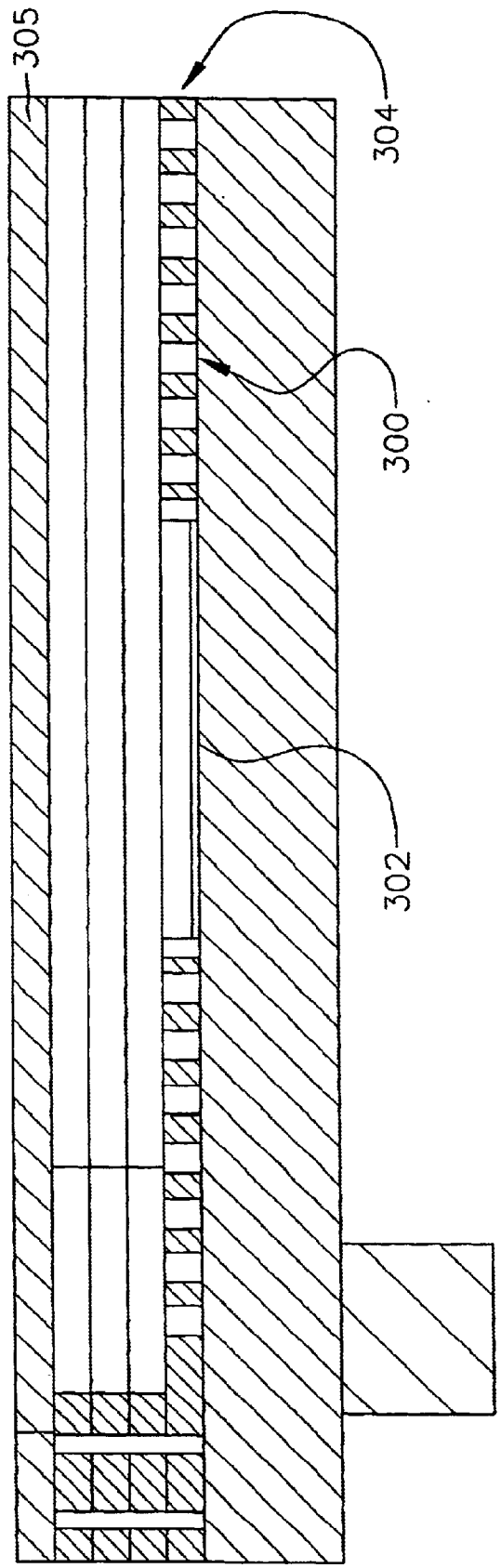
FIG. 3 illustrates a side view of a cross-section of the device of FIG. 1.

Vias 300 connect the metallization layer 302 on top of the substrate 304 with the metallization layer on the bottom of the substrate, as viewed in FIG. 3, which is a cross section of FIG. 2 along the line III—III. As illustrated in the embodiment of FIG. 2, a first set of vias 232 form an array a first row and a second row approximately lining the dieleectric, which in one embodiment is merely an air gap, about the microstrips. The vias are connected to a ground and are spaced so as to provide the electrical equivalent of two solid wave guide walls with respect to signals transmitted in the microstrip. In one embodiment the vias are separated by no more a half wavelength of the signals transmitted on the microstrip, and in a further embodiment are separated by no more than a third of the frequency of the signals transmitted on the microstrip. In the embodiment of FIG. 2 the signals on the microstrip are 40 Ghz signals having a wavelength approximate 0.3 inches, and the vias have diameters of approximately 0.010 inch with centers separated by 0.020 inch.

As may be seen in FIG. 3, the array of vias extend from the first upper section of the leadframe to the metallization on the bottom of the leadframe. When the metal cover 305 is placed over the leadframe the array of vias is in contact with the metal cover. Conveniently, in one embodiment the upper section of the top surface of the leadframe is provided a metallization layer 401 which forms a portion of the metal cover. The use of the metallization layer on the upper section provides for increased hermeticity of the package as a whole.

The increased distance between the bottom of the leadframe and the upper section of the leadframe provides for vias of increased length with respect to the vias about the microstrips. Thus, the vias about the coaxial input provide for wall of greater height and increased shielding about the coaxial input, and particularly the coaxial input which is provided to the leadframe orthogonally with respect to the microstrips.

FIG. 4 illustrates a further cross-section of the package of FIG. 1 along the line IV—IV. The further cross-section illustrates the signal path from a coaxial input to the die. The coaxial input includes a center signal core 408 surrounded by a dielectric 409. The dielectric in turn is enclosed by shielding 410 forming a wave guide.

An end of the core is coupled to a microstrip by the short length of wire. The microstrip, as also may be seen in FIG. 2, leads to the die, with the microstrip being connected to the die by a further length of wire. The signal, therefore, passes from the core through a short wire length, and in doing so the signal path changes direction. After proceeding through the short wire length, the signal proceeds down the microstrip until it reaches the next further length of wire connecting it to the die. Accordingly, the signal passes through transitions in both direction and medium in transitioning from the core to the die.

To the extent each of the transitions introduces discontinuities, the discontinuities result in attenuation of the signal. Transitions in the signal path also result in increased noise and potential signal crosstalk. Signal medium transitions often generally result in introducing capacitance or inductive effects, depending on the nature of the transition.

Accordingly, in one embodiment, elements, particularly capacitive elements are introduced into the coaxial input to provide impedance matching for the transition to the microwire. In the embodiment illustrated in FIG. 4, a glass bead 412 is used to introduce changes of the dielectric surrounding the core, thereby changing the capacitive effects of the coaxial cable. In an alternate embodiment, the core is narrowed, with a neck formed in the core. The neck further introduces capacitive effects.

Figure 5:
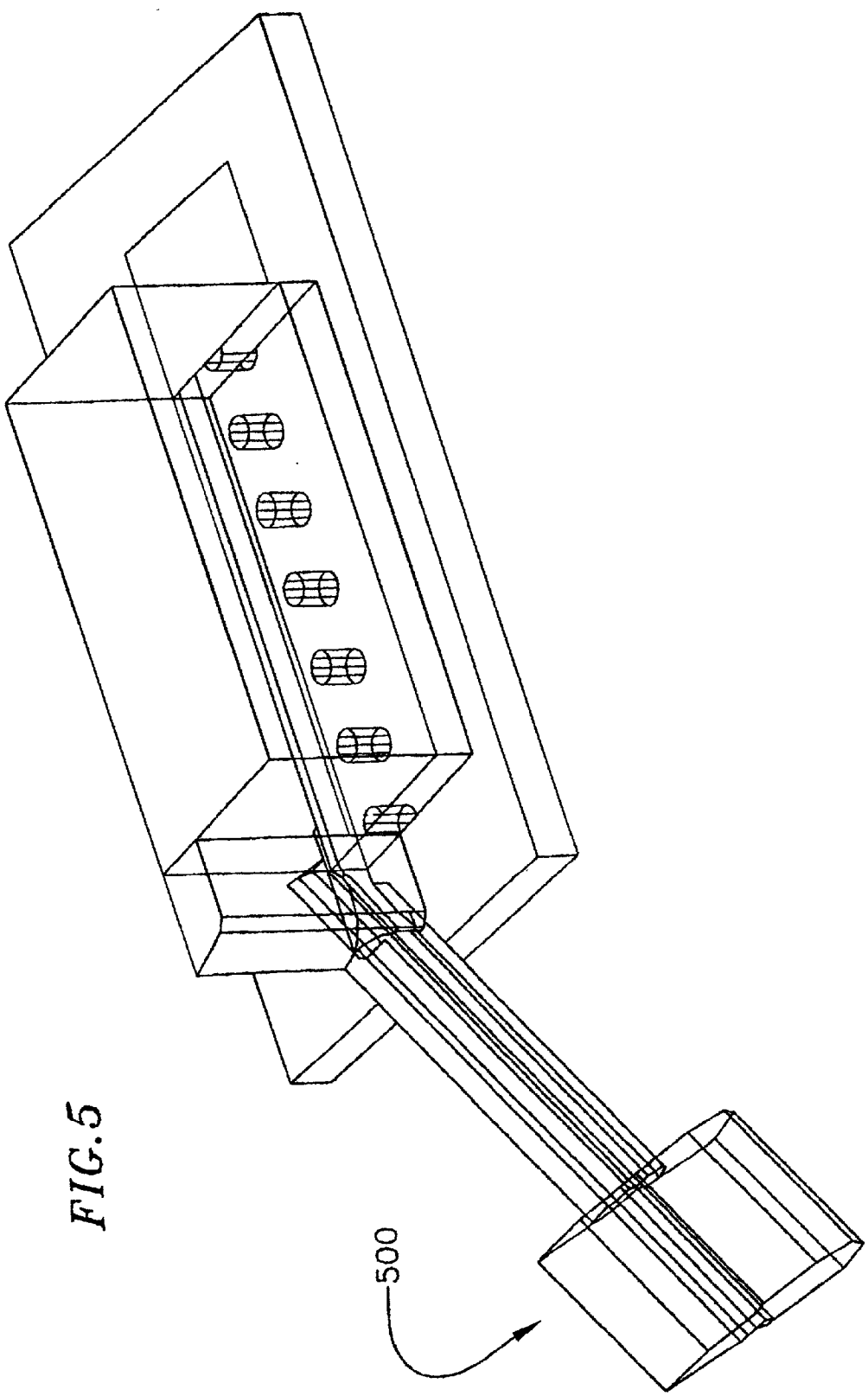
FIG. 5 illustrates a semi-schematic view of an embodiment of the present invention including an angled input cable.

FIG. 5 illustrates a further embodiment of the packaging of the present invention. In the device of FIG. 5, coaxial input 500 to the package is nonplanar and nonorthogonal to the microstrip. Instead, the connector provides the core to the microstrip at approximately a 30 degree angle to a plane formed, for example, by the die or the line formed by the microstrip. It has been found that use of an angled input, as opposed to an orthogonal input such as described with respect to FIG. 1, provides some advantages in terms of reduced signal attenuation at some frequencies. In other embodiments the angle formed by the plane of the die and the connector is between about 10 degrees and about 80 degrees. In addition, certain connection operations, such as connection of the core to the microstrip, is in someways made easier.

Figure 6:
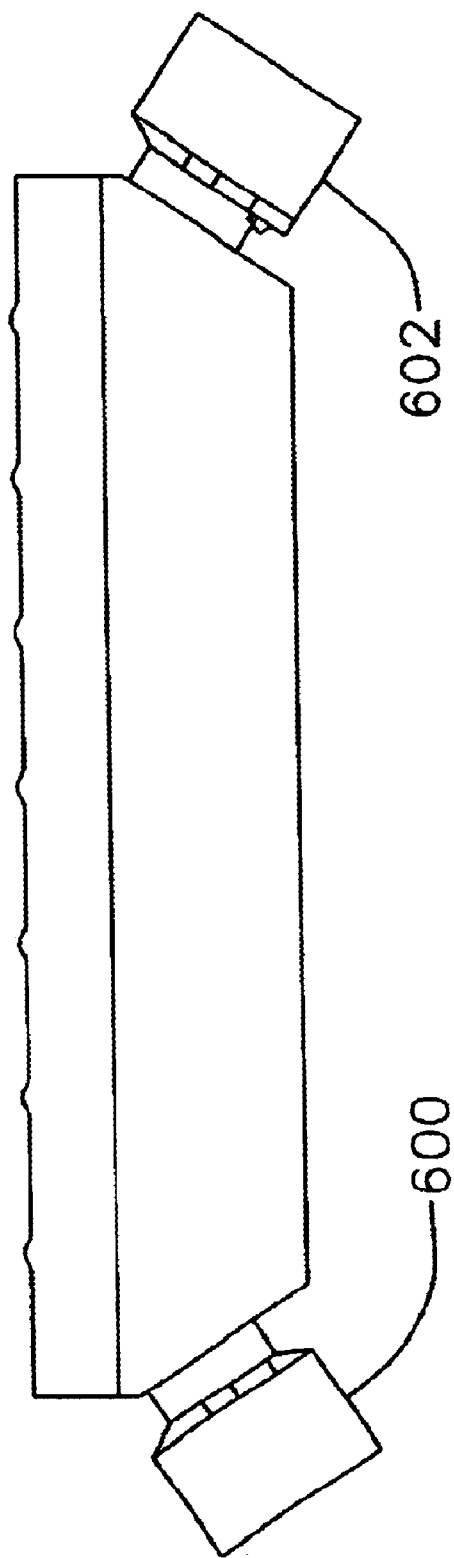
FIG. 6 illustrates a package in accordance with aspects of the present invention with two angled connection ports.

FIG. 6 illustrates an embodiment of the package with dual coaxial angled connections 600 and 602. Such a package may find use, for example, as a package containing a transimpedance amplifier and post-amplifier circuitry receiving high frequency communication signals. For example, in the transimpedance amplifiers receiving up to 40 GHz or higher data signals, the data signals are generally stabilized and amplified to allow for further processing. Both the input signals and the output signals, however, remain at approximately 40 GHz more or less. Accordingly, conveniently the package has a first end with an angled RF input connection as previously described. Similarly, the opposing end of the package provides an angled RF output port. Both of the angled connections are connected, using a coaxial connection and wire length, to a microstrip on the leadframe. Thus, the double angled connector package provides a convenient package for the processing of high frequency input and output signals.

The present invention therefore provides a package and aspects of a package suitable for high frequency signal reception and output. Although this invention has been described in certain specific embodiments, it should be recognized that the invention may be practiced otherwise than as specifically described.

What is claimed is:

1. A packaging device comprising:
   a leadframe including an aperture adapted to pass a signal on a coaxial transmission medium through the leadframe, the leadframe containing a plurality of vias about the aperture, whereby the vias provide electromagnetic shielding of signals passed through the aperture;
   a die operatively disposed on the leadframe and adapted to receive a semiconductor device; and
   a signal path between a location approximate the aperture and a location approximate the die;
   wherein the plurality of vias are arranged in two or more rows.

2. The packaging device as recited in claim 1, wherein the leadframe is a planar structure.

3. The packaging device as recited in claim 1, wherein the plurality of vias are coupled to a ground plane.

4. The packaging device as recited in claim 3, wherein the aperture is at an angle to a plane defined by an upper surface of the die.

5. The packaging device as recited in claim 4, wherein the signal path is a microstrip transmission line having a signal line disposed between a first dielectric strip and a second dielectric strip.

6. The packaging device as recited in claim 1, wherein the leadframe includes an upper metallization layer providing for increased package hermeticity.

7. The packaging device as recited in claim 1, wherein the leadframe is a printed circuit board.

8. The packaging device as recited in claim 1, wherein the leadframe is disposed on a heat spreader.

9. The packaging device as recited in claim 1, wherein the coaxial transmission medium is substantially orthogonal to the signal path.

10. The packaging device as recited in claim 1, wherein the coaxial transmission medium is substantially at an angle between 10 and 80 degrees to the signal path.

11. The packaging device as recited in claim 1, wherein a metal cover is disposed on the leadframe.

12. A packaging device comprising: a leadframe including an aperture adapted to pass a signal on a coaxial transmission medium through the leadframe, the
   leadframe containing a plurality of vias about the aperture, whereby the vias provide electromagnetic shielding of signals passed through the aperture;
   a die operatively disposed on the leadframe and adapted to receive a semiconductor device; and
   a signal path between a location approximate the aperture and a location approximate the die;
   wherein the plurality of vias are coupled to a ground plane;
   wherein the aperture is at an angle to a plane defined by an upper surface of the die;
   wherein the signal path is a micostrip transmission line having a signal line disposed between a first dielectric strip and a second dielectric strip;
   wherein the coaxial transmission medium comprises a waveguide having a center signal core surrounded by a dielectric which is surrounded by a shield.

13. The packaging device as recited in claim 12, wherein an end of the core is coupled to the path by a short wire.

14. The packaging device as recited in claim 13, wherein a capacitive load is placed approximate the end of the core.

15. A packaging device comprising:
   a substrate;
   a die adapted to receive a semiconductor device operatively disposed on the substrate;
   an input port connecting to the substrate at an angle to a plane defined by a surface of the substrate;
   a plurality of vias disposed in the substrate about the input port;
   a signal path on the substrate running from an area approximate the input port to approximate the die; and
   a coaxial transmission medium, adapted to pass a signal, located in the input port and substantially nonplanar to the signal path;
   wherein the plurality of vias are coupled to a ground plane;
   wherein the plurality of vias are arranged in two or more rows.

16. The packaging device as recited in claim 15, wherein the substrate is a planar structure.

17. The packaging device as recited in claim 15, wherein the substrate is disposed on a heat spreader.

18. The packaging device of claim 15, wherein the signal path is a microstrip transmission line having a signal line disposed between a first dielectric gap and a second dielectric gap.

19. The packaging device as recited in claim 18, wherein the coaxial transmission medium is substantially orthogonal to the signal line.

20. The packaging device as recited claim 18, wherein the coaxial transmission medium is nonorthogonal to the signal line.

21. The packaging device as recited in claim 20, wherein the coaxial transmission medium is substantially at an angle between 10 and 80 degrees to the signal line.

22. The packaging device as recited in claim 15, wherein a metal cover is disposed on the substrate.

23. The packaging device as recited in claim 15, wherein the substrate includes an upper metallization layer providing for increased package hermeticity.

24. A packaging device comprising:
   a substrate;
   a die adapted to receive a semiconductor device operatively disposed on the substrate;
   an input port connecting to the substrate at an angle to a plane defined by a surface of the substrate;
   a plurality of vias disposed in the substrate about the input port;
   a signal path on the substrate running from an area approximate the input port to approximate the die; and a coaxial transmission medium, adapted to pass a signal, located in the input port and substantially nonplanar to the signal path;

wherein the signal path is a microstrip transmission line having a signal line disposed between a first dielectric gap and a second dielectric gap;

wherein the coaxial transmission medium is substantially orthogonal to the signal line;

wherein the coaxial transmission medium comprises a waveguide having a center signal core surrounded by a dielectric which is surrounded by a shield.

25. The packaging device as recited in claim 24, wherein an end of the core is coupled to the signal line by a short wire.

26. The packaging device as recited in claim 25, wherein a capacitive element is placed approximate the end of the core.

27. The packaging device as recited claim 26, wherein the capacitive element is a glass bead.

28. The packaging device as recited in claim 24, wherein the plurality of vias are coupled to a ground plane.

29. The packaging device as recited in claim 28, wherein the plurality of vias are arranged in two or more rows.

30. A package for a semiconductor device, the semiconductor device operating on high frequency signals, the semiconductor device being located on a die, comprising:

a substrate adapted for placement of the die at a die location thereon;

means for passing a signal on a coaxial medium to a location on the substrate, the means for passing including a passage with an axis defining an obtuse angle with respect to a plane of the substrate; and a plurality of vias located about the passage;

wherein the center signal core is at approximately a 30 degree angle to a plane defined by the signal line.

* * * * *